United States Patent
Ferraiolo et al.

(10) Patent No.: US 8,082,474 B2
(45) Date of Patent: Dec. 20, 2011

(54) BIT SHADOWING IN A MEMORY SYSTEM

(75) Inventors: Frank D. Ferraiolo, New Windsor, NY (US); Daniel M. Dreps, Georgetown, TX (US); Kevin C. Gower, LaGrangeville, NY (US); Robert J. Reese, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 537 days.

(21) Appl. No.: 12/165,799

(22) Filed: Jul. 1, 2008

(65) Prior Publication Data
US 2010/0005345 A1    Jan. 7, 2010

(51) Int. Cl.
*G06F 11/14* (2006.01)
*G06F 11/30* (2006.01)

(52) U.S. Cl. ........................ 714/704; 714/712

(58) Field of Classification Search .......... None
See application file for complete search history.

(56) References Cited

U.S. PATENT DOCUMENTS

| | | | |
|---|---|---|---|
| 4,034,195 A | 7/1977 | Bates | |
| 4,201,885 A * | 5/1980 | Vrba | 375/357 |
| 4,376,306 A | 3/1983 | Giusto | |
| 4,468,770 A | 8/1984 | Metcalf et al. | |
| 4,631,686 A | 12/1986 | Ikawa et al. | |
| 4,644,498 A | 2/1987 | Bedard et al. | |
| 4,775,979 A | 10/1988 | Oka | |
| 5,321,813 A | 6/1994 | McMillen et al. | |
| 5,513,135 A | 4/1996 | Dell et al. | |
| 6,067,262 A | 5/2000 | Irrinki et al. | |
| 6,070,256 A | 5/2000 | Wu et al. | |
| 6,119,181 A | 9/2000 | Vorbach et al. | |
| 6,147,967 A | 11/2000 | Ying et al. | |
| 6,297,995 B1 | 10/2001 | McConnell et al. | |
| 6,308,286 B1 | 10/2001 | Richmond et al. | |
| 6,337,817 B1 | 1/2002 | Horiguchi et al. | |
| 6,338,154 B2 | 1/2002 | Kim | |
| 6,367,042 B1 | 4/2002 | Phan et al. | |

(Continued)

FOREIGN PATENT DOCUMENTS

EP    1622020 A2    2/2006

(Continued)

OTHER PUBLICATIONS

G. Boudon et al., "Novel Bus Reconfiguration Scheme With Spare Lines", IBM Technical Bulletin, May 1987, pp. 5590-5593.

(Continued)

*Primary Examiner* — Jeffrey A Gaffin
*Assistant Examiner* — Dipakkumar Gandhi
(74) *Attorney, Agent, or Firm* — Cantor Colburn LLP

(57) ABSTRACT

Shadow selection logic is used to select a driver bit position as a shadowed driver value, and line drivers to transmit data for the selected driver bit position and the shadowed driver value on separate link segments of a bus. In addition, shadow compare logic is used to compare a selected received value with a shadowed received value from the bus and identify a miscompare in response to a mismatch of the compare Shadow counters are used to count a rate of the miscompare relative to a bus error rate over a period of time. A defective link segment is identified in response to the rate of the miscompare within a predefined threshold of the bus error rate.

23 Claims, 10 Drawing Sheets

U.S. PATENT DOCUMENTS

| | | | |
|---|---|---|---|
| 6,381,685 B2 | 4/2002 | Dell et al. | |
| 6,518,593 B2 | 2/2003 | Takabayashi et al. | |
| 6,526,461 B1 | 2/2003 | Cliff | |
| 6,531,339 B2 | 3/2003 | King et al. | |
| 6,789,212 B1 | 9/2004 | Klingman | |
| 6,895,528 B2 | 5/2005 | Cantwell et al. | |
| 6,931,564 B2 | 8/2005 | Goodman et al. | |
| 6,973,605 B1 | 12/2005 | Templeton et al. | |
| 7,013,416 B2 | 3/2006 | Whetsel | |
| 7,058,918 B2 | 6/2006 | Abramovici et al. | |
| 7,069,494 B2 | 6/2006 | Cargnoni et al. | |
| 7,093,182 B2 * | 8/2006 | Dickson | 714/770 |
| 7,154,723 B1 | 12/2006 | Warnakulasooriya et al. | |
| 7,168,005 B2 | 1/2007 | Adams et al. | |
| 7,178,076 B1 | 2/2007 | Zarrineh et al. | |
| 7,181,659 B2 | 2/2007 | Bravo et al. | |
| 7,209,453 B1 * | 4/2007 | Yun et al. | 370/242 |
| 7,277,346 B1 | 10/2007 | Rahim et al. | |
| 7,299,313 B2 | 11/2007 | Gower et al. | |
| 7,334,149 B1 | 2/2008 | Wu | |
| 7,353,316 B2 | 4/2008 | Erdmann | |
| 7,362,697 B2 | 4/2008 | Becker et al. | |
| 2002/0024455 A1 | 2/2002 | Abbiate et al. | |
| 2002/0075982 A1 | 6/2002 | Doblar | |
| 2003/0074619 A1 | 4/2003 | Dorsey | |
| 2003/0185251 A1 | 10/2003 | Ichino et al. | |
| 2004/0180455 A1 | 9/2004 | Marr | |
| 2004/0190331 A1 | 9/2004 | Ross et al. | |
| 2004/0216026 A1 | 10/2004 | Ferraiolo et al. | |
| 2004/0250181 A1 | 12/2004 | Vogt et al. | |
| 2004/0258039 A1 * | 12/2004 | Stephens | 370/349 |
| 2005/0138496 A1 | 6/2005 | Brennan et al. | |
| 2005/0174138 A1 | 8/2005 | Marr | |
| 2005/0210185 A1 | 9/2005 | Renick | |
| 2005/0223196 A1 | 10/2005 | Knowles | |
| 2005/0246597 A1 | 11/2005 | Whetsel | |
| 2005/0273632 A1 * | 12/2005 | Kawakami | 713/193 |
| 2005/0281112 A1 * | 12/2005 | Ito et al. | 365/222 |
| 2006/0036827 A1 | 2/2006 | Dell et al. | |
| 2006/0095620 A1 | 5/2006 | Dreps et al. | |
| 2006/0107175 A1 | 5/2006 | Dell et al. | |
| 2006/0179369 A1 | 8/2006 | Bravo et al. | |
| 2006/0179394 A1 | 8/2006 | O'Neill et al. | |
| 2006/0218455 A1 | 9/2006 | LeClair et al. | |
| 2006/0277363 A1 | 12/2006 | Qiu et al. | |
| 2007/0011562 A1 | 1/2007 | Alexander et al. | |
| 2007/0075734 A1 | 4/2007 | Ramos et al. | |
| 2007/0204190 A1 | 8/2007 | Hesse et al. | |
| 2007/0283223 A1 | 12/2007 | Dell et al. | |
| 2007/0288816 A1 | 12/2007 | Nakanishi | |
| 2007/0300129 A1 | 12/2007 | Dell et al. | |
| 2008/0005644 A1 | 1/2008 | Dell | |
| 2008/0022186 A1 | 1/2008 | Co et al. | |
| 2008/0028345 A1 | 1/2008 | Suri et al. | |
| 2008/0046774 A1 | 2/2008 | Hirai et al. | |
| 2008/0046796 A1 | 2/2008 | Dell et al. | |
| 2008/0065938 A1 | 3/2008 | Cowell et al. | |
| 2008/0115137 A1 | 5/2008 | Gower et al. | |

FOREIGN PATENT DOCUMENTS

| | | |
|---|---|---|
| JP | 02-307254 | 12/1990 |
| JP | 03-234125 | 10/1991 |
| JP | 09-261210 | 10/1997 |

OTHER PUBLICATIONS

Sunggu Lee, et al., "Probabilistic Diagnosis of Multiprocessor Systems", ACM Computing Surveys, Mar. 1994, pp. 121-139, vol. 26, No. 1.

Alan Charlesworth et al., "The Starfire SMP Interconnect", 1997, pp. 1-20, ACM.

Daniele Rossi et al., "New ECC for Crosstalk Impact Minimization", Jul./Aug. 2005, pp. 340-348 IEEE CS and the IEEE CASS.

Smitha Shyam et al., "Ultra Low-Cost Defect Protection for Microprocessor Pipelines", ASPLOS'06, Oct. 21-25, 2006, pp. 73-82, ACM, San Jose, California, USA.

D.M Berger et al., "High-Speed source-synchronous interface for the IBM System z9 processor" IBM J. Res & Dev., Jan. 2007, pp. 53-64, vol. 51, No. 1/2, IBM.

FBDIMM: Architecture and Protocal, Jan. 2007, JESD206, JEDEC Solid State Technology Association, Arlington, VA USA.

\* cited by examiner

FIG. 7

DATA ASSIGNMENT TO BUS LANES

| BUS LANE | 0 | 1 | 2 | 3 | 4 | 5 | 6 | 7 | 8 | 9 | 10 | 11 | 12 | 13 (SP1) | 14 (SP1) |
|---|---|---|---|---|---|---|---|---|---|---|---|---|---|---|---|
| NORMAL OPERATION | 0 | 1 | 2 | 3 | 4 | 5 | 6 | 7 | 8 | 9 | 10 | 11 | 12 | unused | unused |
| STEP X Shadowing Data 6/Lane 6 on Lane 7 Checking Lane 7 | 0 | 1 | 2 | 3 | 4 | 5 | 712 6 | 710 6 S | 7 | 8 | 9 | 10 | 11 | 12 | unused |
| STEP X+1 Shadowing Data 6/Lane 6 on Lane 7 Checking Lane 6 | 0 | 1 | 2 | 3 | 4 | 5 | 716 6 S | 718 6 | 7 | 8 | 9 | 10 | 11 | 12 | unused |
| Repaired Normal Operation with Lane 6 repaired | 0 | 1 | 2 | 3 | 4 | 5 | 722 BAD | 6 | 7 | 8 | 9 | 10 | 11 | 12 | unused |
| STEP 1 Shadowing Data 12/ Lane 13 on Lane 14 Checking Lane 14 | 0 | 1 | 2 | 3 | 4 | 5 | 726 BAD | 6 | 7 | 8 | 9 | 10 | 11 | 12 | 728 12 S |
| STEP 2 Shadowing Data 12/ Lane 13 on Lane 14 Checking Lane 12 | 0 | 1 | 2 | 3 | 4 | 5 | 734 BAD | 6 | 7 | 8 | 9 | 10 | 11 | 736 12 S | 738 12 |
| STEP Y Shadowing Data 5/Lane 5 on Lane 7 Checking Lane 7 | 0 | 1 | 2 | 3 | 4 | 746 5 | 742 BAD | 744 6 S | 6 | 7 | 8 | 9 | 10 | 11 | 12 |

BIT SHADOWING IN A MEMORY SYSTEM

BACKGROUND

This invention relates generally to computer memory systems, and more particularly to providing bit shadowing in a memory system.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

SUMMARY

An exemplary embodiment is a communication interface device that includes shadow selection logic to select a driver bit position as a shadowed driver value, and line drivers to transmit data for the selected driver bit position and the shadowed driver value on separate link segments of a bus. The communication interface device also includes shadow compare logic to compare a selected received value with a shadowed received value from the bus and identify a miscompare in response to a mismatch of the compare, and shadow counters to count a rate of the miscompare relative to a bus error rate over a period of time. A defective link segment is identified in response to the rate of the miscompare within a predefined threshold of the bus error rate. In addition, the bus cascade interconnects the communication interface device with a second communication interface device, and the bus further comprises downstream lanes and upstream lanes of differential-ended unidirectional link segments. The downstream lanes comprising: 13 downstream bit lanes, 2 spare downstream bit lanes, and a downstream clock, and the upstream lanes comprising: 20 upstream bit lanes, 2 spare upstream bit lanes and an upstream clock.

Another exemplary embodiment is a memory system including a memory controller and a memory hub device in communication with the memory controller via a bus. The memory controller includes shadow selection logic to select a driver bit position as a shadowed driver value, and line drivers to transmit data for the selected driver bit position and the shadowed driver value on separate link segments of the bus. The memory hub device includes shadow compare logic to compare a selected received value with a shadowed received value from the bus and identify a miscompare in response to a mismatch of the compare, and shadow counters to count a rate of the miscompare relative to a bus error rate over a period of time. A defective link segment is identified in response to the rate of the miscompare within a predefined threshold of the bus error rate.

An additional exemplary embodiment is a method for providing bit shadowing in a memory system. The method includes selecting a driver bit position as a shadowed driver value, and transmitting data for the selected driver bit position and the shadowed driver value on separate link segments of a bus, the bus including downstream lanes and upstream lanes of differential-ended unidirectional link segments. The method further includes comparing a selected received value with a shadowed received value from the bus, identifying a miscompare in response to a mismatch of the compare, counting a rate of the miscompare relative to a bus error rate over a period of time, and identifying a defective link segment in response to the rate of the miscompare being within a predefined threshold of the bus error rate.

A further exemplary embodiment is a design structure tangibly embodied in a machine-readable medium for designing, manufacturing, or testing an integrated circuit. The design structure includes shadow selection logic to select a driver bit position as a shadowed driver value, and driver logic to transmit data for the selected driver bit position and the shadowed driver value on separate link segments of a bus. The design structure also includes shadow compare logic to compare a selected received value with a shadowed received value from the bus and identify a miscompare in response to a mismatch of the compare. The design structure further includes counting logic to count a rate of the miscompare relative to a bus error rate over a period of time, where a defective link segment is identified in response to the rate of the miscompare within a predefined threshold of the bus error rate.

Other systems, methods, apparatuses, design structures and/or computer program products according to embodiments will be or become apparent to one with skill in the art upon review of the following drawings and detailed description. It is intended that all such additional systems, methods, apparatuses, design structures and/or computer program products be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES:

FIG. 7 depicts an example of bit shadowing that may be implemented by exemplary embodiments;

DETAILED DESCRIPTION OF EXEMPLARY EMBODIMENTS

Figure 1:
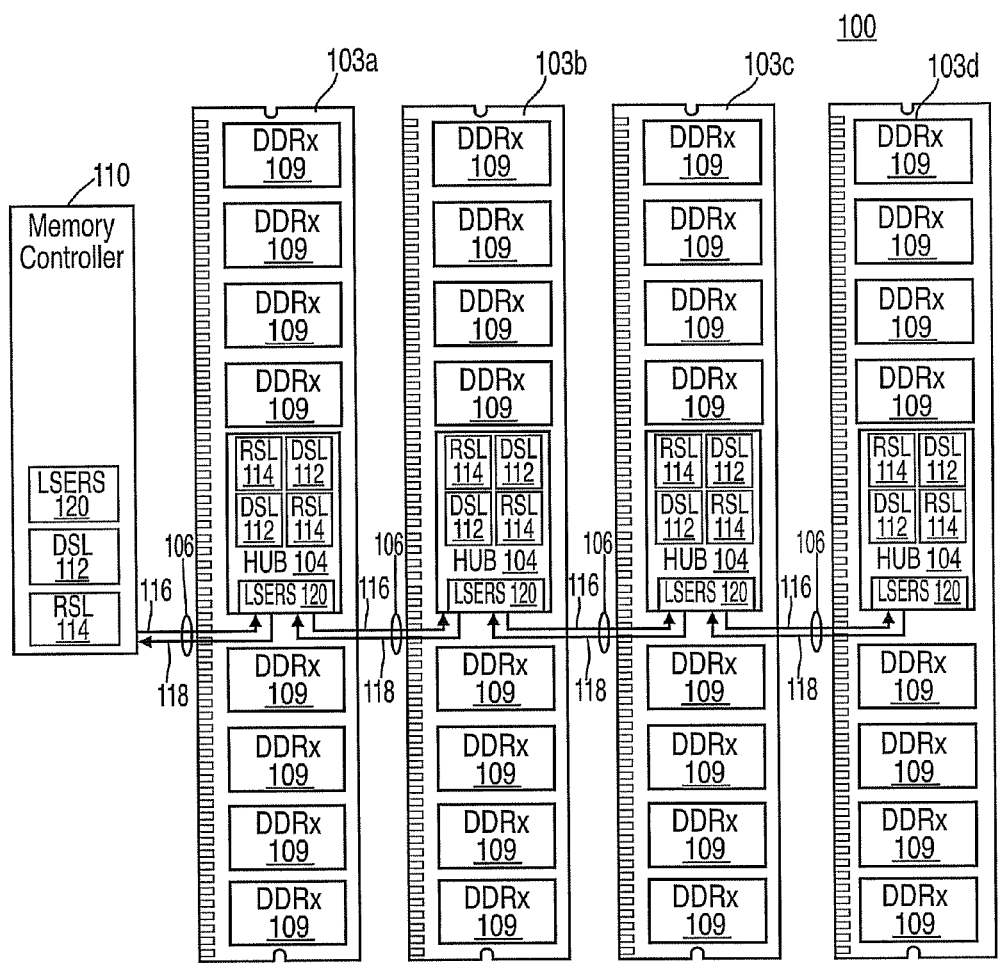
FIG. 1 depicts a cascade interconnected memory system that includes fully buffered DIMMs communicating via high-speed upstream and downstream links with bit shadowing that may be implemented by exemplary embodiments.

As large computer systems become increasing more complex, the number of interconnections between integrated circuits or chips in the computer systems also increases. The number of interconnections, for example between a microprocessor to memory, the microprocessor to other microprocessors, the microprocessors to cache or I/O chips, are increasing to the point where today's large computer systems may have tens of thousands of interconnections between chips within the system. These signals can be carried on metal wires from a transmit chip through a chip carrier, to cards and/or boards, possibly through several connectors to a receiver chip on a second carrier. All of the interconnections and signals should be manufactured and remain defect free over the life of the product; otherwise, a system failure can occur. A single failure or latent defect typically impacts part or all of the computer system's operation.

In an exemplary embodiment, bit shadowing for a memory system of a computer system is provided. Bit shadowing supports detection of interconnection failures and dynamically reconfigure signals around defects to maintain operation by sending the same signal on multiple physical connections. Furthermore, bit shadowing detects intermittent problems that occur over a period of time. This may apply to any chip-to-chip interface (i.e., a bus) within a computer or a computer system that sends data, control, or address information to communicate, such as a memory bus in a memory system.

In an exemplary embodiment, cascaded bus interconnections between physical devices, such as communication interface devices, can detect intermittent failures occurring over a period of time and repair themselves with failures in data or clock segments of the bus. This allows multiple defects to exist while enabling the system to maintain normal operation. Bit shadowing takes advantage of an otherwise unused spare link segment or bus lane, sending a redundant value for a selected bit position as a shadowed value on a separate link relative to the selected bit position. A comparison between the received versions of the selected bit position and the shadowed value can be used to identify an error in one of the two link segments for the two signals. Since some number of errors can be expected on any communication interface, this may not itself be sufficient to identify a particular link segment as defective. However, a communication channel such as the cascade interconnected bus can be characterized with an expected bit error rate per link segment (or bit lane) and an expected bus error rate. When the bus error rate increases beyond an error rate threshold that is considered to be acceptable, bit shadowing can be performed. For a random distribution, each link segment is expected to contribute an approximately equal fractional value to the total bus error rate. Using bit shadowing, one link segment (or bit lane) may be assumed healthy as the selected bit position while its corresponding shadowed value serves as a lane or link segment under test (LUT). If the rate of miscompares between the received versions of the selected bit position and the shadowed value are within a predefined threshold of the bus error rate, then the LUT is identified as defective. If the rate of miscompares matches an expected fractional value of the normal bus error rate, then the LUT is considered healthy. Thus, by rotating through each bit position, the bus can be fully tested to isolate defects. If all link segments (or bit lanes) have miscompare rates below the predefined threshold of the bus error rate, then the clock link segment of the bus can be identified as defective. Once a defective link segment (or bit lane) is identified, sparing logic can be used to switch out the defect and continue with normal operation. Applying bit shadowing to a high-speed cascade interconnected memory system can improve the reliability of the memory system as failures in different segments between cascaded devices are accommodated, including data link segments and clock link segments.

Turning now to FIG. 1, an example of a memory system 100 that includes fully buffered dual in-line memory modules (DIMMs) communicating via high-speed upstream and downstream links using bit shadowing is depicted. The memory system 100 may be incorporated in a host processing system as main memory for the processing system. The memory system 100 includes a number of DIMMs 103*a*, 103*b*, 103*c* and 103*d* with memory hub devices 104 communicating via a cascade-interconnected bus 106. The DIMMs 103*a*-103*d* can include multiple memory devices 109, which may be double data rate (DDR) dynamic random access memory (DRAM) devices, as well as other components known in the art, e.g., resistors, capacitors, etc. The memory devices 109 are also referred to as DRAM 109 or DDRx 109, as any version of DDR may be included on the DIMMs 103*a*-103*d*, e.g., DDR2, DDR3, DDR4, etc. A memory controller 110 interfaces with DIMM 103*a*, sending commands, address and data values via the bus 106 that may target any of the DIMMs 103*a*-103*d*. If a DIMM receives a command that is not intended for it, the DIMM redrives the command to the next DIMM in the daisy chain (e.g., DIMM 103*a* redrives to DIMM 103*b*, DIMM 103*b* redrives to DIMM 103*c*, etc.). The commands, address and data values may be formatted as frames and serialized for transmission at a high data rate, e.g., stepped up in data rate by a factor of four; thus, transmission of commands, address and data values is also generically referred to as "data" or "high-speed data".

The memory controller 110 includes drive-side switching logic (DSL) 112 and receive-side switching logic (RSL) 114 to control the assignment of specific signals to segments of the bus 106. The bus 106 includes downstream link segments 116 and upstream link segments 118 as unidirectional links between devices in communication over the bus 106. Connections between each DIMM 103*a*-103*d*, as well as between DIMM 103*a* and memory controller 110 are referred to as "link segments" or "segments". A communication path across multiple bus segments, such as spanning from the memory controller 110 to DIMM 103*d*, is referred to as a "bus lane" (e.g., bit 0 on all of the downstream link segments 116). To reduce susceptibility to noise and other coupling interference, differential-ended signaling may be used for all bit lanes of the bus 106, including one or more differential-ended clocks. In an exemplary embodiment, the downstream link segments 116 and the upstream link segments 118 each include 2 spare link segments that can be used to dynamically repair a failed link segment by switching signal assignments such that one or both of the spare link segments become active, as well as to support bit shadowing. Link segment error registers (LSERs) 120 in the memory controller 110 and the memory hub devices 104 can be used to identify link segment errors and make spare lane selections in the DSL 112 and RSL 114. The DSL 112 can drive signals on either the downstream link segments 116 or the upstream link segments 118, while the RSL 114 receives signals on either the downstream link segments 116 or the upstream link segments 118. The DSL 112 includes shadow selection logic to select bit positions for shadowing. The RSL 114 includes error detection logic to detect bus errors and miscompares between selected received values and shadowed received values, which can detect and isolate link segments or bit lanes with intermittent defects. Each memory hub device 104 may include a DSL 112/RSL 114 pair for driving and receiving communications on the downstream link segments 116 and a second DSL 112/RSL 114 pair for upstream link segments 118 of the bus 106. Thus, since the memory controller 110 and the memory hub devices 104 can include one or more of the DSL 112 and RSL 114, they represent examples of apparatuses for practicing the invention.

Although only a single memory channel is shown in FIG. 1 connecting the memory controller 110 to a single memory device hub 104, systems produced with these modules may include more than one discrete memory channel from the memory controller, with each of the memory channels operated singly (when a single channel is populated with modules) or in parallel (when two or more channels are populated with modules) to achieve the desired system functionality and/or performance. Moreover, any number of lanes can be included in the bus 106. For example, the downstream link segments 116 can include 13 bit lanes, 2 spare lanes and a clock lane, while the upstream link segments 118 may include 20 bit lanes, 2 spare lanes and a clock lane.

Figure 2:
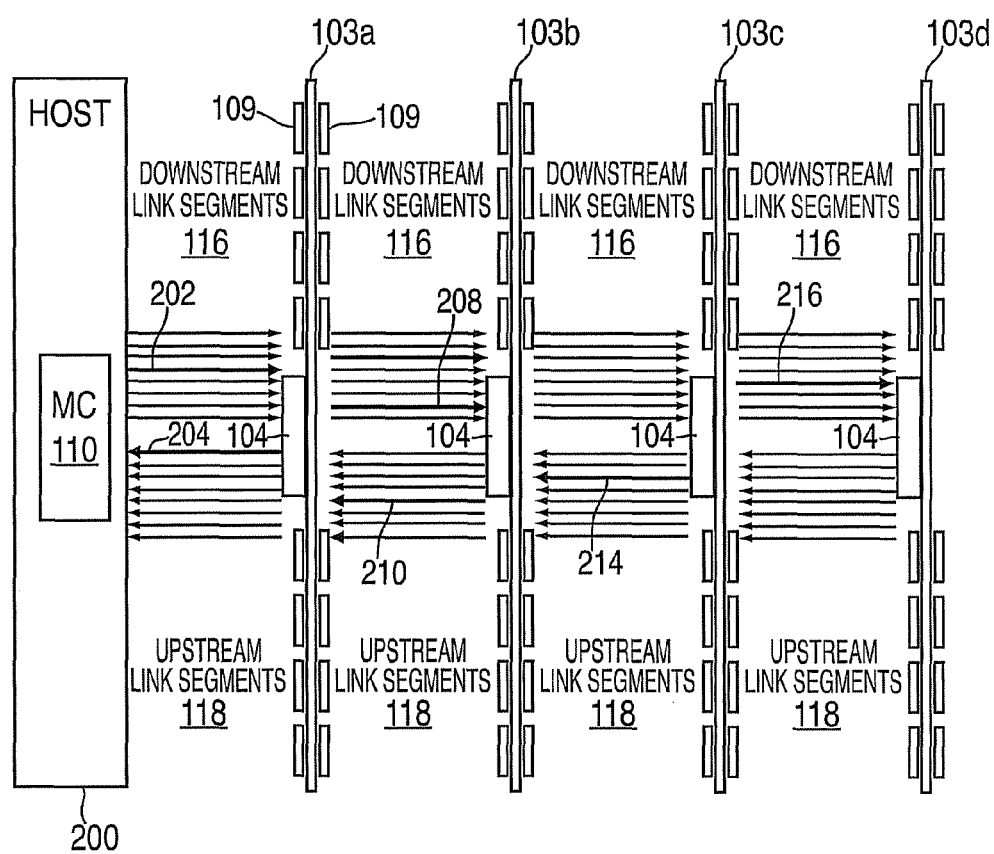
FIG. 2 depicts a cascade interconnected memory system with specific upstream and downstream segments identified for bit shadowing that may be implemented by exemplary embodiments.

FIG. 2 depicts the memory system 100 of FIG. 1 with specific upstream and downstream segments identified for bit shadowing. In FIG. 2, the memory controller 110 is incorporated in host processing system 200 and is cascade interconnected to DIMM 103a via downstream link segments 116 and upstream link segments 118 to memory hub device 104 on the DIMM 103a. It can also be seen in FIG. 2 that the DIMM 103a, as well as DIMMs 103b-d may be dual sided, having memory devices 109 on both sides of the modules. Initially, all downstream and upstream lanes are powered-on, tested and aligned during initialization, but defective lanes and unneeded (unused) spares are deactivated during normal run-time operation. System control software, such as firmware can be used to determine transitions between testing bit lanes and selecting bit lanes for repair, which may be performed as part of a memory system initialization and configuration process prior to commencing normal operation. For example, each memory hub device 104 and the memory controller 110 can cycle through training states to detect firm errors on bit lanes and/or clocks of the downstream link segments 116 and the upstream link segments 118. Each training state can be divided into specific tasks to be performed prior to achieving a normal high-speed mode of operation. For instance, training states may include clock detection and repair (TS0), configuration and calibration (TS1), downstream lane training and repair (TS2), and upstream lane training and repair (TS3).

When a hard failure in any link segment is detected, a spare link segment is activated and replaces the defective link segment in the downstream link segments 116 or the upstream link segments 118. The memory system communication format, error detection and protocols are the same before and after spare lane invocation. When bit shadowing is invoked, intermittent failures can also be detected during normal operation without reverting to initialization. Initialization is typically a rapid sequence of operations over a period of milliseconds, so intermittent errors may not appear during this short test window. Additionally, certain errors may only occur during normal operation when the memory system 100 is subjected to a more dynamic environment of switching high-speed signals. Each segment of the downstream link segments 116 and the upstream link segments 118 can independently deploy their dedicated spares on a per link basis. This maximizes the ability to survive multiple failures in different link segments. For instance, link segments 202, 204, 208, 210, 214, and 216 are highlighted as examples of link segments that could be replaced by spare link segments to maintain normal operation as well as continue bit shadowing. The drive-side switching and receive-side switching are performed independently in each upstream and downstream direction. Should multiple link segment failures occur such that all spare link segments are required, then bit shadowing may be disabled. For systems that include additional spare lanes, e.g., 3 or more, multiple link segment failures can be handled and bit shadowing kept active provided that at least one spare is available for use in bit shadowing.

In an exemplary embodiment, the spare lanes are tested and aligned during initialization and deactivated during normal run-time operation. Sparing (switching out a failed link segment) can be performed during initialization based on previous lane failure data. Spare link segments can also be selected dynamically by hardware during run-time as part of error recovery. The error recovery may include re-initialization and repair of links by switching out a failed link. The memory controller 110 can initiate and perform error recovery rapidly to a prevent system timeout, e.g., less than 10 milliseconds. System control software running on the host processing system 200 can load LSERs 120 of FIG. 1 in the memory controller 110 and memory hub devices 104 to control selection of signals for each link segment.

A failed link can be detected using a variety of techniques. For example, during initialization one or more patterns can be sent on the downstream link segments 116 and upstream link segments 118 to verify that received patterns match the transmitted patterns for detecting hard failures. During normal operation, an error correcting code (ECC) or other error detection and/or correction technique can be used to detect a failure. Once a failed link is detected, the memory system 100 may initiate one or more retry operations to confirm the failure, and then revert to a training state to isolate the specific failed link segment. Repair and re-initialization operations can be performed if any retry operation fails. The memory hub devices 104 may also indirectly initiate memory channel repair and re-initialization in response to detecting a persistent error that is not corrected via a retry from the memory controller 110. However, if upon a retry the error does not persist, the error may be an intermittent error. When the intermittent error occurs with a sufficiently high frequency, it can be disruptive to normal operation. Moreover, frequent intermittent errors can indicate that a hard failure is imminent. Therefore, bit shadowing can be initiated when a threshold number of retries are detected over a period of time to identify a specific defective link segment or bit lane. Bit shadowing can be particularly helpful if bus errors are detected using techniques that cannot themselves identify a specific bit lane or link segment that is errant (e.g., a cyclic redundancy check (CRC) vs. ECC).

Figure 3:
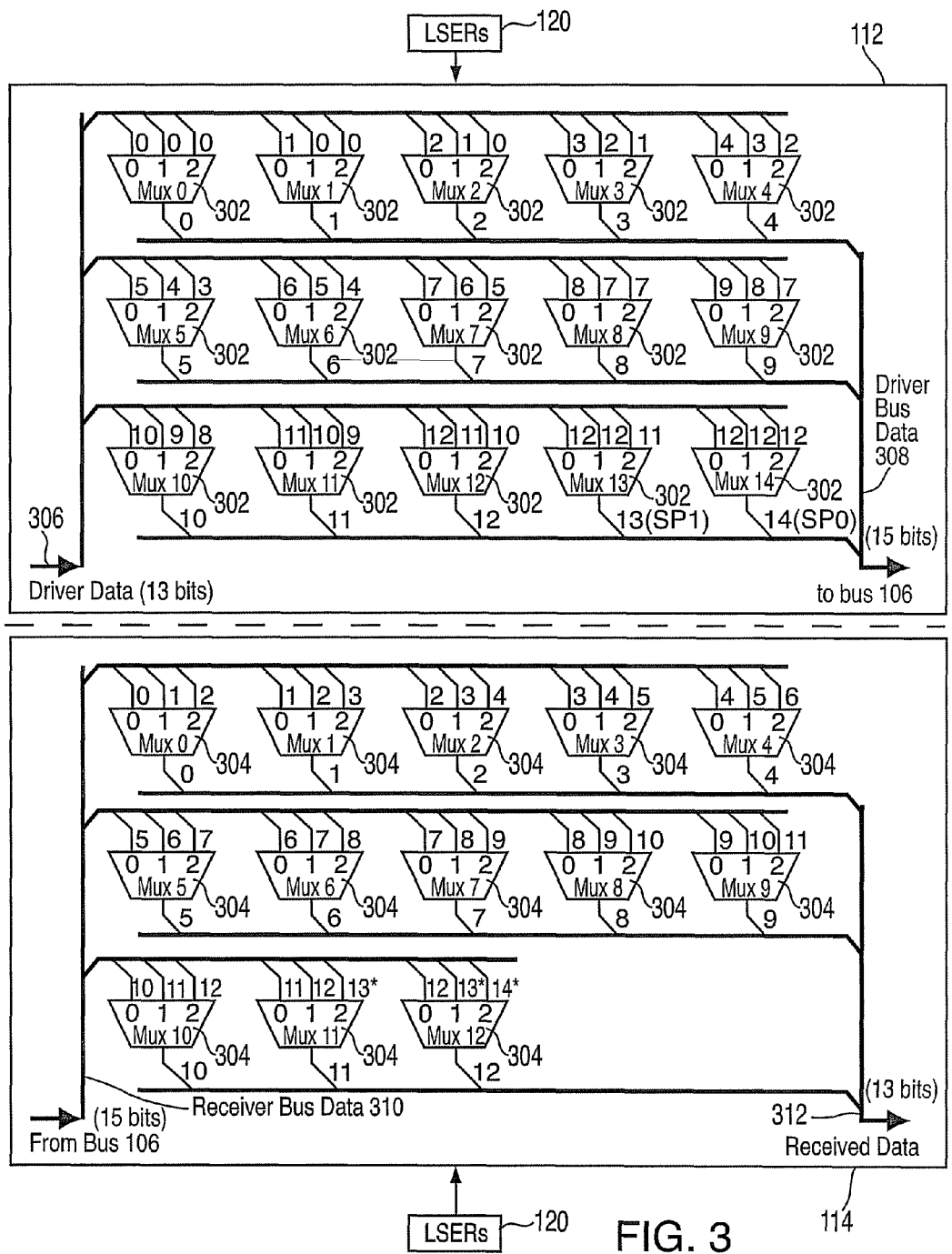
FIG. 3 depicts an example of drive-side and receive-side switching logic that may be implemented by exemplary embodiments.

Referring to FIG. 3, greater detail of the DSL 112 and the RSL 114 of FIG. 1 is depicted. For purposes of explanation the DSL 112 and the RSL 114 of FIG. 3 are assumed to be in communication from the DSL 112 to the RSL 114, e.g., DSL 112 of memory controller 110 and RSL 114 of DIMM 103a connected via downstream link segments 116. The DSL 112 includes multiple 3-to-1 driver multiplexers (muxes) 302, and the RSL 114 includes multiple 3-to-1 receiver muxes 304. The driver muxes 302 control switching of specific bits of driver data 306 to driver bus data 308, which is output on bus 106. Similarly, the receiver muxes 304 control switching of specific receiver bus data 310 received via the bus 106 and output the results as received data 312 that can be used by the memory controller 110 or one of the memory hub devices 104. In the example depicted in FIG. 3, 13 bits of driver data 306 are routed in groups of three to 15 driver muxes 302. The output of the 15 driver muxes 302 includes 2 spare signals that may be a redundant version of one or two bits of the driver data 306. The receiver bus data 310 includes 15 bits that correspond to the driver bus data 308 when no errors are present. The receiver muxes 304 select 13 of the 15 bits of the receiver bus data 310 to output as 13 bits of received data 312. The LSERs 120 interfaced to the DSL 112 and the RSL 114 control selection of specific bits at each of the driver muxes 302 and the receiver muxes 304 respectively.

Figure 4:
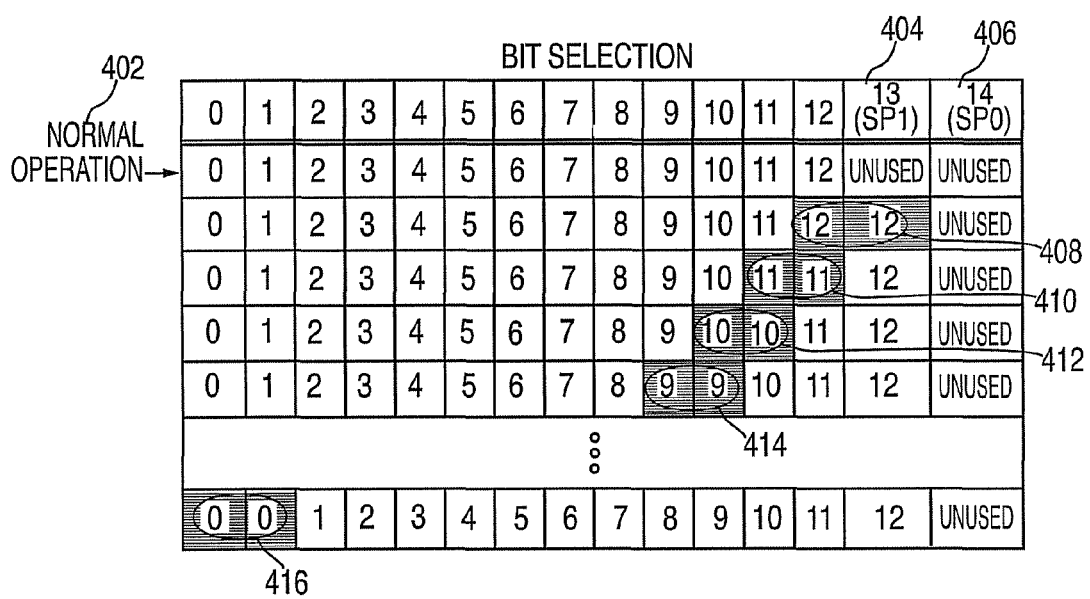
FIG. 4 depicts data assignments for bus lanes that may be implemented by exemplary embodiments.

Initially, in the absence of any defects, the control signals to the driver muxes 302 and the receiver muxes 304 are set to all zero, selecting the 0 inputs. Referring to FIG. 4, the first row 402 indicates bit selections for normal operation. In this example, spare segments sp1 404 and sp0 406 are powered down (unused) to save power. Subsequent rows depict examples of bit pairs, where one link segment is considered to be bad, resulting in a shift to steer the data from the defective link segment to a functional link segment. A similar mux control vector on the receive side selects all zero inputs to the receiver muxes 304. For example, if bit 12 is determined to be bad then the mux controls in the LSERs 120 are set to zeros on the driver muxes 302 for muxes 0 through 11 and mux 13 is set to a 1. This action steers lane 12 data down link segment 13 of the bus 106, which could be a downstream link segment 116 or an upstream link segment 118. On the receive side, muxes 0-11 of the receiver muxes 304 remain unchanged (set to zero) and bit 12 (mux 12 of the receiver muxes 304) is set to a 1 to steer link segment 13 on the bus 106 to bit 12 of the received data 312. The shift in position is depicted in bit selection pair 408.

Similar to the case with bit 12, if bit (link segment 11 of the lane) 11 is determined to be defective, then the mux controls are set to zeros on the driver muxes 302 for muxes 0-10 and mux 12 and mux 13 are set to a 1. This action steers link segment 11 data down link segment 12 and steers link segment 12 data down link segment 13 of the bus 106. On the receive side, muxes 0-10 of the receiver muxes 304 remain unchanged (set to zero) and bit 11 (mux 11 of the receiver muxes 304) is set to a 1 to steer link segment 12 on the bus 106 to bit 11 and similarly mux 12 of the receiver muxes 304 is set to a 1 to steer bit 13 to link segment 12. The shift in position is depicted in bit selection pair 410. This process can performed using any bit pairs, e.g., bit pairs 412, 414, down to bit pair 416.

In a similar way any bad or defective link segment can be steered to the adjacent link segment and all signals further down or upstream (depending on the specific defective link segment) from the defect can be shifted by one link segment as well. If both link segments 11 and 12 are defective, then both spares sp1 404 and sp0 406 are employed. In this case, mux 14 is set to a logical 2, mux 13 to a logical 1, and muxes 0-10 are kept at their normal logic zero on the driver muxes 302. This action steers bit 12 down link segment 14 and bit 11 down link segment 13. On the receiver muxes 304, mux 12 is set to a logical 2, mux 11 is set to a logical 1, and all other muxes are set to a logical 0. This action steers bit 11 and bit 12 from link segments 13 and 14 back to their correct bit positions. Hence, two defects can be corrected.

In an exemplary embodiment, the mux controls (LSERs 120) are typically not changed during normal operation since altering the signal paths in real time requires precise timing and coordination between both ends of the link when operating at high speed. A bad link segment may be identified prior to functional operation, during an initialization or power on procedure where specific patterns are transmitted down each lane and checked on the received side for proper operation. If during the initialization process a defective link segment is identified, it can be spared out using one of the available spares. A bad link segment may also be detected during functional operation. Using an ECC, for example, the bad link segment can be spared out in a relatively short period of time, avoiding full re-initialization, to allow the defective signal (or signals) to be re-routed and spare bits utilized. The bus 106 can then be brought back online, and functional operation returns. This may utilize a subset of training states. In an alternate exemplary embodiment, link errors are detected in functional operation with no isolation mechanism present, and hence the link is prompted to reinitialize. It is during the reinitialization process, where predetermined patterns are sent down each link segment and the link segments are interrogated as good or bad, that the defective link segment may be discovered and repaired. When the defect is intermittent, occurring only temporarily, then bit shadowing can be used to identify defects in specific link segments or bit lanes, including a clock.

Figure 5:
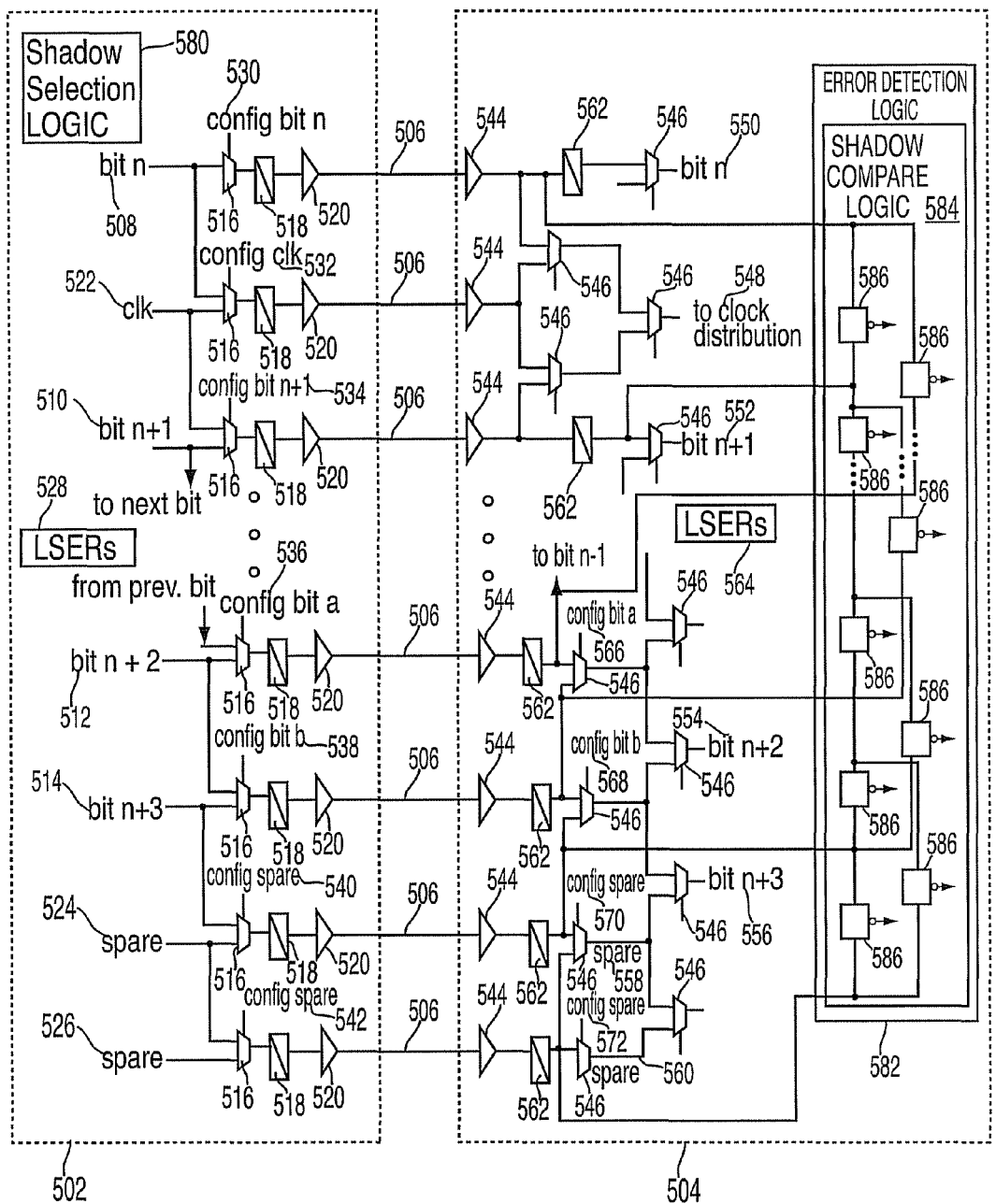
FIG. 5 depicts data and clock repair logic with bit shadowing that may be implemented by exemplary embodiments.

Referring to FIG. 5, if any of the link segments are assigned as a bus clock then the bus clock can also be repaired. FIG. 5 depicts DSL 502 in communication with RSL 504 via link segments 506. The DSL 502 drives data bits, such as bit n 508, bit n+1 510, bit n+2 512, bit n+3 514, etc., through driver muxes 516, driver latches 518, and line drivers 520 to the link segments 506. Each of the driver muxes 516 can select from multiple signals to drive, as one of the data bits 508-514, a clock 522, or one of the spares 524 and 526. The selection of signals controlling the driver muxes 516 is driven by configuration signals of the LSERs 528 (e.g., config bit n 530, config clk 532, config bit n+1 534, config bit a 536, config bit b 538, config spare 540 and config spare 542). Additionally, shadow selection logic 580 can also be used to control the driver muxes 516 when bit shadowing is enabled. For example, the shadow selection logic 580 may modify values in the LSERs 528 to transmit both a selected driver bit position and a copy of the driver bit position as a shadowed driver value on parallel link segments 506.

On the receive side at RSL 504, the link segments 506 are coupled to receiver circuits 544, which may amplify and otherwise condition the signals received. To support clock sparing, link segments 506 that can carry a clock signal may be driven into receiver muxes 546 without latching and prior to clock distribution 548. This avoids duplication of the clock distribution 548, which distributes the received clock, for example in the memory controller 110 or in a memory hub device 104. The muxing for data repair(s) can also be performed right after the receiver circuits 544, before sampling or after receiver latches 562 as well. Detection of a defective clock can be performed using similar approaches as for bad data link segments. For example, during initialization the clock can be tested looking across multiple data lanes for global functionality or be redriven and sent to another chip (a memory hub device 104) with a known good clock to be tested. During normal operation multiple bad bits across the bus 106 may indicate a clock problem and prompt a clock repair. As part of the initialization, the clock 522 may be swapped out or tested. A defective clock may be shifted directly to a spare link segment or can be shifted to an adjacent link segment with subsequent data link segments shifted to utilize one of the spare link segments. If the clock 522 has intermittent failures, then bit shadowing can be used to identify this condition as well. During normal operation with bit shadowing, an intermittent clock failure can be detected as a degradation of the bus bit error rate with all link segments showing approximately the same bit error rate. For data or spare bits, such as bit n 550, bit n+1 552, bit n+2 554, bit n+3 556 and spares 558 and 560, received signals on the receiver circuits 544 are buffered using receiver latches 562 prior to the receiver muxes 546. The selection of signals controlling the receiver muxes 546 is driven by configuration signals of LSERs 564 (e.g., config bit a 566, config bit b 568, config spare 570 and config spare 572). While the receiver muxes 546 are depicted as 2 input muxes, they are effectively made into higher order muxes by staging multiple receiver muxes 546.

Figure 6:
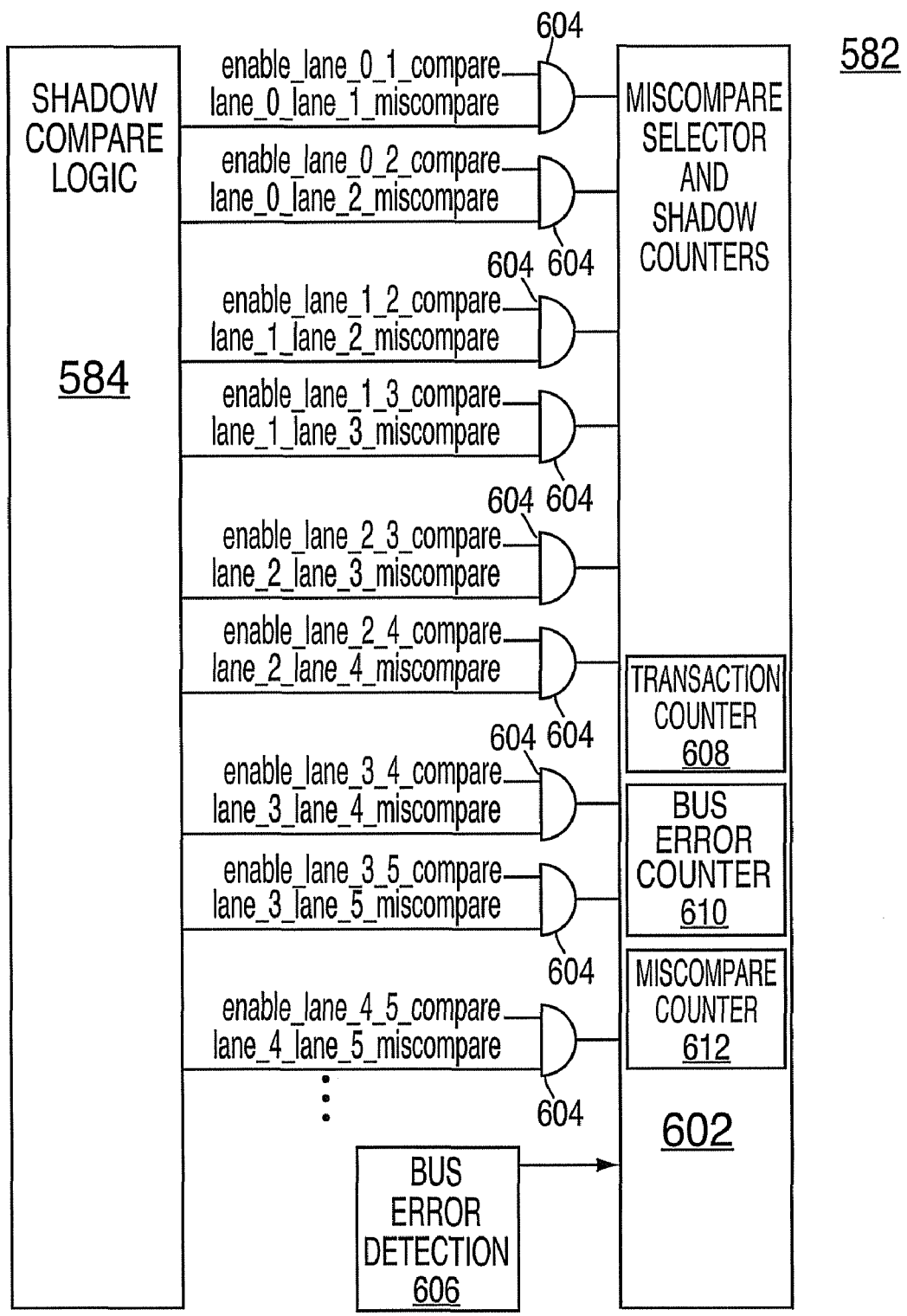
FIG. 6 depicts bit shadowing logic that may be implemented by exemplary embodiments.

The RSL 504 also includes error detection logic 582 with shadow compare logic 584. During bit shadowing, the same data pattern or electrical signals are sent down two different physical wires (link segments 506) at the same time. A logical comparison can then be made between the received data to determine if they compare or miscompare using compare blocks 586. The compare blocks 586 can compare values received via the link segments 506, and may be arranged such that each value received on the link segments 506 can be compared with the next higher or lower bit position. For example, assuming that 13 bus lanes are available to transmit data, the compare blocks 586 can be connected between position 12 and 11, as well as 11 and 10 to cover shifts in either direction relative to position 11. The comparison between the two lanes is then compared to a global error detection mechanism or bus error rate. Further details are depicted in FIG. 6, where the shadow compare logic 584 interfaces with miscompare selector and shadow counters 602. And-gate functions 604 can be interposed between the shadow compare logic 584 and the miscompare selector and shadow counters 602 to select particular comparison sets for bit shadowing. The selected pair is input to the miscompare selector and shadow counters 602, as well as a bus error value from bus error detection 606. In an exemplary embodiment, the bus error detection 606 performs a check on all active link segments 506 other than the link segment 506 assigned as the shadow value. The error detection technique may be a CRC.

Various counters in the miscompare selector and shadow counters 602 calculate rates to identify a defective link segment. Transaction counter 608 counts the number of bus transactions over a period of time, providing a basis for rate calculations. Bus error counter 610 counts the number of bus errors detected by bus error detection 606. Miscompare counter 612 counts the number of miscompares of a selected pair for bit shadowing. Thus, the bus error rate can be calculated as the bus error counter 610 divided by the transaction counter 608, and the rate of miscompares can be calculated as the miscompare counter 612 divided by the transaction counter 608. Alternatively, the bus error counter 610 may only accumulate on retry operations after a failure is detected.

FIG. 7 depicts an example of bit shadowing that may be implemented by exemplary embodiments. While the example depicted in FIG. 7 refers to data assignments for 15 bus lanes including two spares, sp1 702 on lane 13 and sp0 704 on lane 14, the example may be applied to any number of lanes or link segments. Data assignments to bus lanes in row 706 represents default assignments for normal operation, with sp1 702 and sp0 704 unused (and depowered). As bit shadowing is performed, data assignments to bus lanes shift with the position assigned for shadowing rotated across the bus. At step X 708, lane 7 is the shadowed value 710 of selected position 712 in lane 6. The same data is sent down lane 7 as is sent down lane 6 in unison. The functional data from lane 6 is still sent as part of normal operation, with the shadowed value 710 on lane 7 provided for testing. To accommodate shadowing on lane 7, the data assignments are shifted one position, and sp1 702 provides additional capacity for bit position 12. Once lane 7 is confirmed healthy, the shadowed value 710 is shifted by one position and becomes shadowed value 716 in step X+1 714 on lane 6. Shadowed value 716 is compared against selected position 718 for a mismatch. At a higher level, bus-level error detection is performed across lanes 0-5 and 7-13, using for example, a CRC. The CRC calculation can be performed on received data and compared to the CRC transmitted. If a bus error is detected in response to a CRC mismatch, then a comparison can be made between the two copies of lane 6 as to whether the shadowed value 716 equals the value of the selected position 718.

Since the example depicted in FIG. 7 includes 13 bits on the bus under normal circumstances and assuming the bit errors are equally distributed across the bus, then lane 6 would account for approx $1/13$ of the total bus errors (CRC checks). The shadowed value 716 (LUT) is assumed to have a bit error rate (BER) of $10^{}-12$ (one error in $10^{}12$ bits) as are all the other lanes too. Hence the ratio of lane 6 miscompares to total bus errors would be $\sim 1/13$ or 0.077 in normal operation. If, however, lane 6 had a BER of $10^{}-8$ while all the other bits on the bus maintained their error rate at $10^{}-12$, then the lane 6 errors would saturate the bus error rate and the ratio of lane 6 errors to bus errors would approach 1. If lane 6 was a good lane and another lane on the bus had a BER=$10^{}-8$, then the bus error counter 610 would be much greater than lane 6 miscompare counter 612 (approximately $10^{}4$). Hence, a bad lane can be isolated from a good lane by comparing the ratio of the shadow lane error rate or miscompare counter 612 to the overall bus error rate or bus error counter 610. Since the lane error comparison is being made using a shadowing bit, it does not affect normal operation. If errors occur in bursts this correctly detects the failures, unlike a retry or recreation of the problem. Further, if after a period of time lane 6 is shown to be good, then it can be used to support shadowing of a different lane to continue in search of a bad lane. When performing bit shadowing, the timing between the transmit side and receive side in not critical. The lane sparing and switching of the muxes, e.g., muxes 516 and 546, can happen independently and at very different times. A simple, slow coordination and control between the two ends of the link is managed for proper sequencing.

At row 720, normal operation continues with bad lane 722 repaired through shifting data positions onto different lanes. The shifting utilizes the capacity provided by sp1 702 on lane 13, with sp0 704 still available for use. At step 724, shadowing continues around bad lane 726, as bit position 12 is tested as shadowed value 728 on lane 14 of selected position 730. Here, the spare lane sp0 704 is tested. The process continues at step 2 732 while avoiding bad lane 734 to test bit lane 13 carrying bit position 12 as shadowed value 736 of selected position 738. The shadowing continues down the bus one bit at a time. At step Y 740, shadowing is performed around bad lane 742 with bit position 5 shadowed on lane 7 as shadowed value 744 to compare against selected position 746 on lane 5. Using 3:1 muxes or multiple staged muxes can provide switching to continue bit shadow testing around a bad lane, such as bad lane 742.

Figure 8:
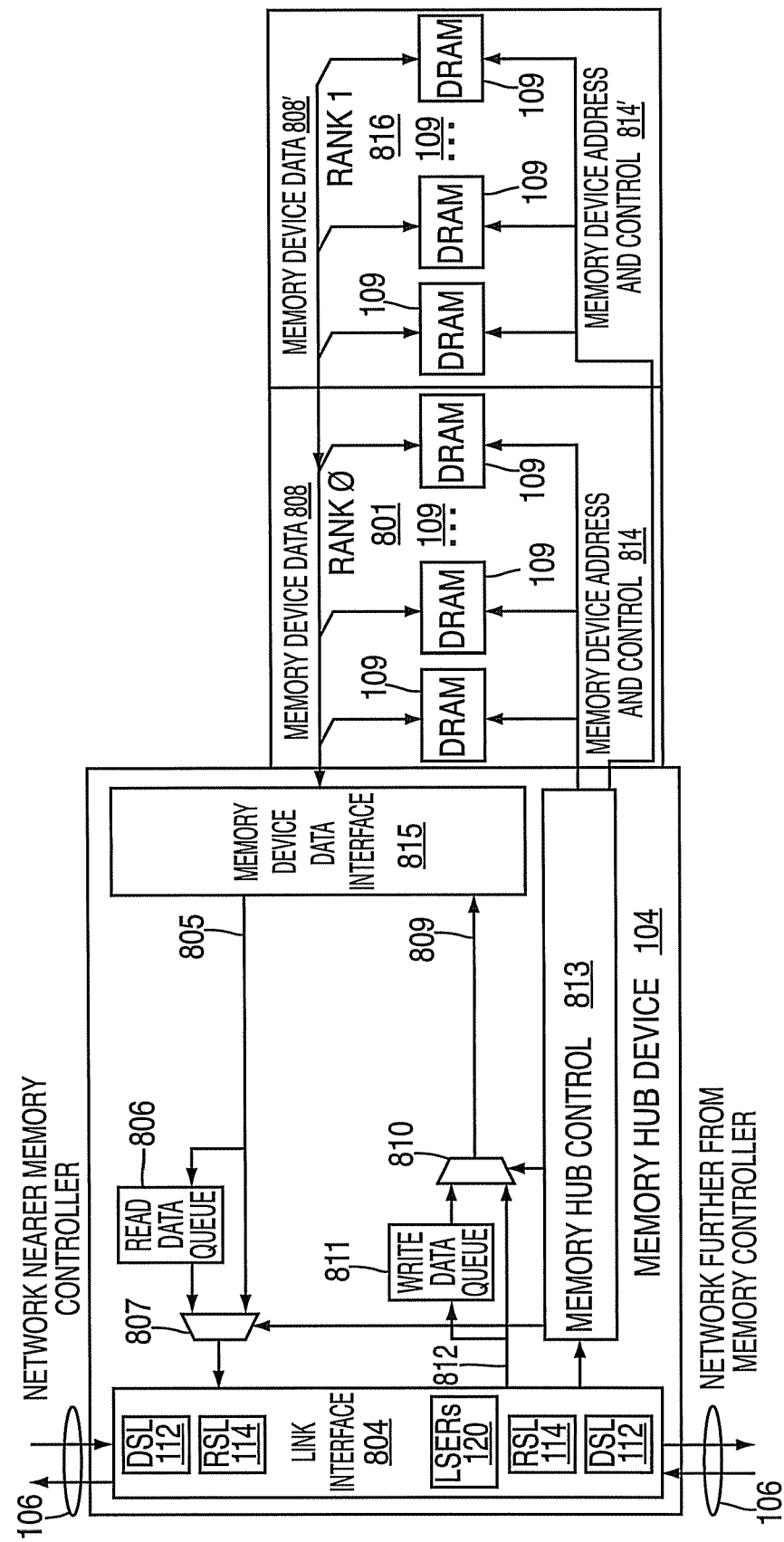
FIG. 8 depicts a memory hub device coupled with multiple ranks of memory devices that may be implemented by exemplary embodiments.

FIG. 8 depicts a block diagram of the memory hub device 104 of FIG. 1 with additional detail, including a link interface 804 for providing means to re-synchronize, translate and re-drive high speed memory access information to associated DRAM devices 109 and/or to re-drive the information downstream on memory bus 106 as applicable based on the memory system protocol. The memory hub device 104 supports multiple ranks (e.g., rank 0 801 and rank 1 816) of DRAM 109 as separate groupings of memory devices using a common hub. The link interface 804 includes LSERs 120, DSLs 112 and RSLs 114 to support segment sparing, repair, and bit shadowing in upstream and downstream directions on memory bus 106. Data and clock link segments are received by the link interface 804 from an upstream memory hub device 104 or from memory controller 110 (directly or via an upstream memory hub device 104) via the memory bus 106. Memory device data interface 815 manages a technology-specific data interface with the memory devices 109 and controls bidirectional memory data bus 808. The memory hub control 813 responds to access request packets by responsively driving the memory device technology-specific address and control bus 814 (for memory devices in rank 0 801) or address and control bus 814' (for memory devices in rank 1 816) and directing read data flow 807 and write data flow 810 selectors. The link interface 804 decodes the packets and directs the address and command information directed to the memory hub device 104 to the memory hub control 813. Memory write data from the link interface 804 can be temporarily stored in the write data queue 811 or directly driven to the memory devices 109 via the write data flow selector 810 and internal bus 812, and then sent via internal bus 809 and memory device data interface 815 to memory device data bus 808. Memory read data from memory device(s) 109 can be queued in the read data queue 806 or directly transferred to the link interface 804 via internal bus 805 and read data selector 807, to be transmitted on the upstream bus 106 as a read reply packet.

While FIG. 1 depicts the memory system 100 as cascade interconnected, the scope of the invention is not limited to cascade interconnected memory systems. For example, the architecture depicted in FIG. 8 may be planar or integrated on a DIMM. The memory hub device 104 can communicate with memory devices 109 on industry standard registered, buffered, or unbuffered DIMMs via busses 808 and 814, regardless of whether or not one or more of the memory hub device 104 are physically located on the DIMMs. Furthermore, a single instance of the bus 106 can exist between the memory hub device 104 and the memory controller 110 with further cascaded instances of the bus 106 omitted within the scope of the invention.

Figure 9:
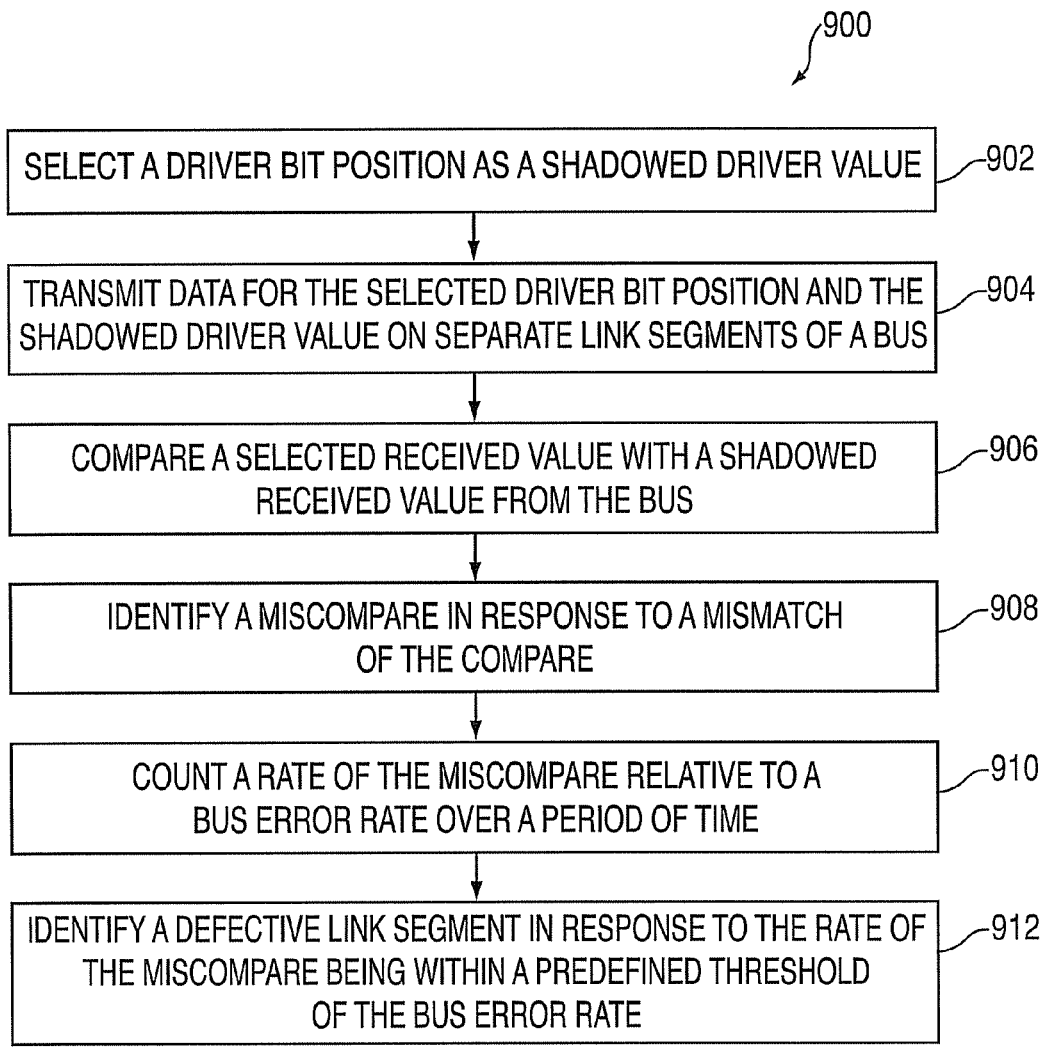
FIG. 9 depicts an exemplary process for bit shadowing in a cascade interconnected memory system that may be implemented by exemplary embodiments.

FIG. 9 depicts a process 900 for providing bit shadowing in a memory system that may be implemented as described in reference to FIGS. 1-8. For example, the process 900 may be implemented in the memory controller 110 and/or the memory hub devices 104 of FIG. 1 as communication interface devices. At block 902, the shadow selection logic 580 of FIG. 5 selects a driver bit position as a shadowed driver value. The shadowed driver value is a copy of the value at the driver bit position, such as shadowed value 710 and selected position 712 of FIG. 7. The LSERs 120 can be used to assign signals to specific link segments 506 or lanes via the driver muxes 516.

At block 904, the line drivers 520 transmit data for the selected driver bit position and the shadowed driver value on separate link segments 506 of the bus 106. The bus 106 may include downstream lanes and upstream lanes of differential-ended unidirectional link segments, as depicted in FIGS. 1 and 2. The downstream lanes may include 13 downstream bit lanes, 2 spare downstream bit lanes, and a downstream clock, while the upstream lanes can include 20 upstream bit lanes, 2 spare upstream bit lanes and an upstream clock.

At block 906, the shadow compare logic 584 compares a selected received value with a shadowed received value from the bus 106. The compare can be performed using compare blocks 586 to check for equivalency between the values. At block 908, the miscompare selector and shadow counters 602 of FIG. 6 identifies a miscompare in response to a mismatch of the compare of block 906. At block 910, shadow counters in the miscompare selector and shadow counters 602 count a rate of the miscompare relative to a bus error rate over a period of time, for example, using bus error counter 610, transaction counter 608, and miscompare counter 612. At block 912, the miscompare selector and shadow counters 602 or other logic in the error detection logic 582 identifies a defective link segment in response to the rate of the miscompare being within a predefined threshold of the bus error rate. For instance, the predefined threshold can be a ratio comparison, where a link segment or lane is identified as defective when it accounts for 50% or more of the bus error rate. A clock link segment of the bus 106 can be identified as defective in response to the rate of the miscompare for all data link segments of the bus 106 being below the predefined threshold of the bus error rate and the bus error rate being above an error rate threshold. In other words, when there is a sufficient number of bus errors to demand bit shadowing, if none of the bit lanes contribute substantially to the overall bus error rate, then the most likely source of the error is the clock.

The driver muxes 302 and the receiver muxes 304 can be configured to switch out a defective link segment and to rotate bit shadowing through each link segment or lane. Rotating bit positions associated with the selected driver bit position, the shadowed driver value, the selected received value, and the shadowed received value enables testing of multiple link segments of the bus 106. To conserver power, unused link segments can be depowered, including a defective link segment, once identified. Unused link segments can also be used for other functions, such as sending out-of-band communication and/or test signals.

Figure 10:
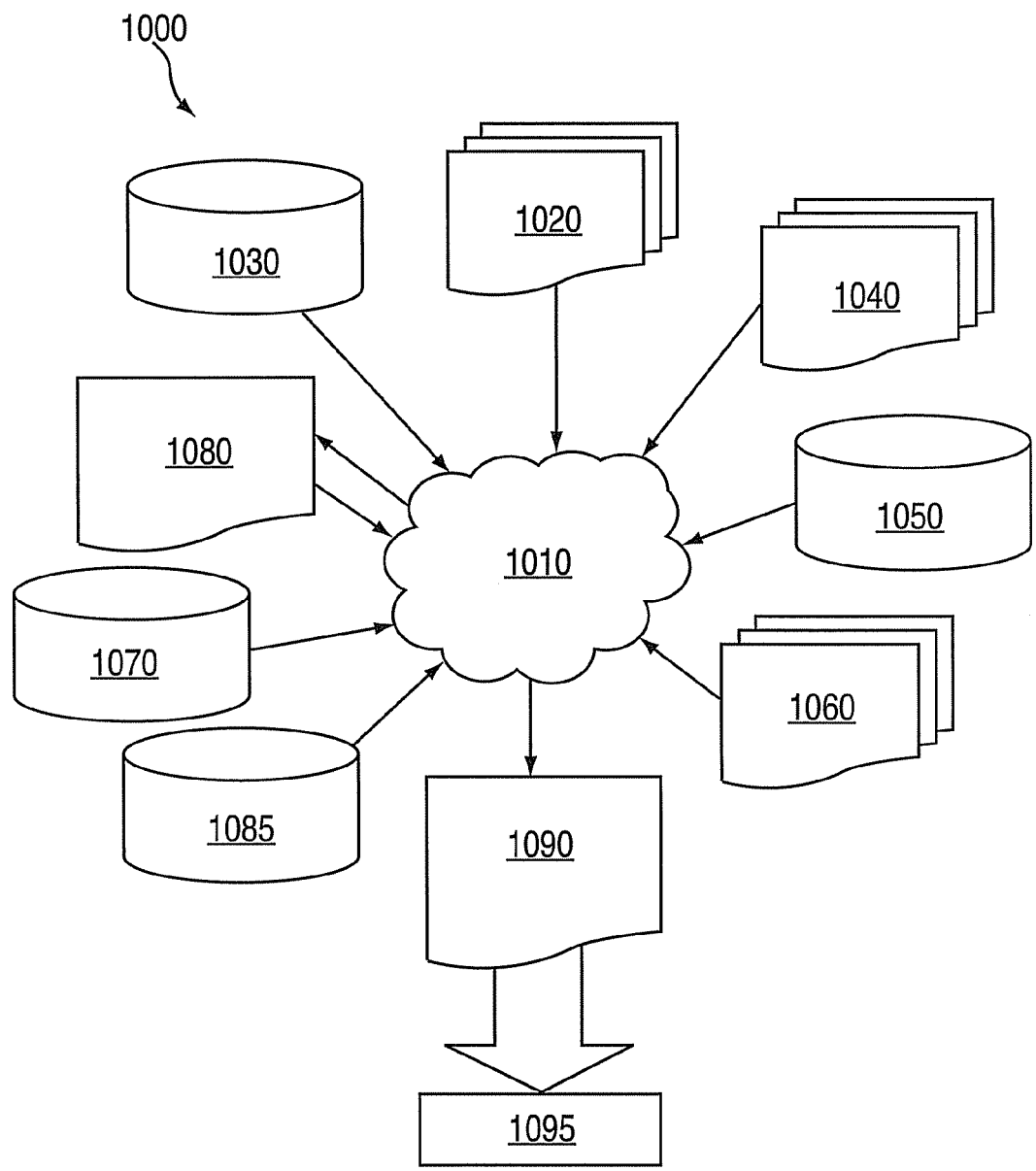
FIG. 10 is a flow diagram of a design process used in semiconductor design, manufacture, and/or test.

FIG. 10 shows a block diagram of an exemplary design flow 1000 used for example, in semiconductor IC logic design, simulation, test, layout, and manufacture. Design flow 1000 includes processes and mechanisms for processing design structures or devices to generate logically or otherwise functionally equivalent representations of the design structures and/or devices described above and shown in FIGS. 1-9. The design structures processed and/or generated by design flow 1000 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 1-9. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 1-9 to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 1090 may comprise a compiled, executable HDL simulation model that functionally simulates the devices shown in FIGS. 1-9.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 1090 may then proceed to a stage 1095 where, for example, design structure 1090: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The capabilities of the present invention can be implemented in software, firmware, hardware or some combination thereof.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with one or more processors and one or more I/O units (e.g., requestors) interconnected to a memory system that contains a memory controller and one or more memory devices. In exemplary embodiments, the memory system includes a processor or memory controller communicating with one or more hub devices (also referred to as "hub chips") which are attached to one or more ports or channels of the memory controller. The memory controller channels may be operated in parallel, thereby providing an increased data bus width and/or effective bandwidth, operated separately, or a combination therein as determined by the application and/or system design. The hub devices connect and interface to the memory devices either by direct connection (e.g. wires) or by way of one or more intermediate devices such as external buffers, registers, clocking devices, conversion devices, etc. In exemplary embodiments the computer memory system includes a physical memory array comprised of one or more volatile and/or non-volatile storage devices for storing such information as data and instructions. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or assembly that includes two or more hub devices that are cascaded interconnected to each other (and may further connect to another hub device located on another memory module) via the cascade interconnect, daisy chain and/or other memory bus structure.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device receives and generally translates and re-drives at least a portion of the received information in the memory access request(s) to the memory devices to initiate such operations as the storing of "write" data from the hub device or to provide "read" data to the hub device. Data read from the memory device(s) is generally encoded into one or more communication packet(s) and transmitted through the memory bus(es) to the memory controller or other requester—although the data may also be used by one or more of the hub devices (e.g. during memory "self-testing") or by another device having access to the hub, such as a service processor, test equipment, etc.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links (e.g. memory channels or ports) to connect to one or more hub chips and/or memory devices.

The memory modules may be implemented by a variety of technologies including a dual in-line memory module (DIMM), a single in-line memory module (SIMM), a triple in-line memory module (TRIMM), and quad in-line memory module (QUIMM), various "small" form-factor modules (such as small outline DIMMs (SO DIMMs), micro DIMMs, etc) and/or other memory module or card structures. In general, a DIMM refers to a circuit board which is often comprised primarily of random access memory (RAM) integrated circuits or die on one or both sides of the board, with signal and/or power contacts also on both sides, along one edge of the board that are generally have different functionality that the directly and/or diagonally opposed contacts. This can be contrasted to a SIMM which is similar is composition but having opposed contacts electrically interconnected and therefore providing the same functionality as each other. For TRIMMs and QUIMMs, at least one side of the board includes two rows on contacts, with other board types having contacts on multiple edges of the board (e.g. opposing and/or adjacent edges on the same side of the board), in areas away from the board edge, etc. Contemporary DIMMs includes 168, 184, 240, 276 and various other signal pin or pad counts, whereas past and future memory modules will generally include as few as tens of contacts to hundreds of contacts. In exemplary embodiments described herein, the memory modules may include one, two or more hub devices.

In exemplary embodiments, the memory bus is constructed using point-to-point connections between hub devices and/or a hub device and the memory controller, although other bus structures such as multi-drop busses may also be used. When separate "upstream" and "downstream" (generally unidirectional) busses are utilized (together comprising the memory "bus"), the "downstream" portion of the memory bus, referred to as the downstream bus, may include command, address, data and other operational, initialization or status information being sent to one or more of the hub devices that are downstream of the memory controller. The receiving hub device(s) may simply forward the information to the subsequent hub device(s) via bypass circuitry; receive, interpret and re-drive the information if it is determined by the hub(s) to be targeting a downstream hub device; re-drive some or all of the information without first interpreting the information to determine the intended recipient; or perform a subset or combination of these functions.

The upstream portion of the memory bus, referred to as the upstream bus, returns requested read data and/or error, status or other operational information, and this information may be forwarded to the subsequent hub devices and/or the memory control device(s) via bypass circuitry; be received, interpreted and re-driven if it is determined by the hub(s) to be targeting an upstream hub device and/or memory controller in the processor complex; be re-driven in part or in total without first interpreting the information to determine the intended recipient; or perform a subset or combination of these functions.

In alternate exemplary embodiments, the point-to-point bus includes a switch, re-drive or bypass mechanism which results in the bus information being directed to one of two or more possible hub devices during downstream communication (communication passing from the memory controller to a hub device on a memory module), and which may also direct upstream information (communication from a hub device on a memory module toward the memory controller), often by way of one or more upstream hub devices. Further embodiments include the use of continuity modules, such as those recognized in the art, which, for example, can be placed between the memory controller and a first populated memory module (e.g., a memory module that includes a hub device that is in communication with one or more memory devices), in a cascade interconnect memory system, such that any intermediate module positions between the memory controller and the first populated memory module includes a means by which information passing between the memory controller and the first populated memory module device can be received even if the one or more intermediate module position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device/module. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include conventional main memory storage devices such as one or more volatile memory device(s). In other exemplary embodiments, the continuity or re-drive function may be comprised as a hub device that is not placed on a memory module (e.g. the one or more hub device(s) may be attached directly to the system board or attached to another carrier), and may or may not include other devices connected to it to enable functionality.

In exemplary embodiments, the memory system includes one or more hub devices on one or more memory modules connected to the memory controller via one or more cascade interconnect memory buses, however one or more other bus structure(s) or a combination of bus structures may be implemented to enable communication such as point-to-point bus(es), multi-drop bus(es) or other shared or parallel bus(es), often allow various means of communication (e.g. including both high speed and low speed communication means). Depending on the signaling methods used, the intended operating frequency range, space, power, cost, and other constraints, various alternate bus structures may also be considered. A point-to-point bus may provide optimal performance (e.g. maximum data rate) in systems produced with high frequency signaling utilizing electrical interconnections, due to the reduced signal degradation that may occur as compared to bus structures having branched signal lines (such as "T" nets, multi-drop nets or other forms of "stubs". However, when used in systems requiring communication with a large number of devices and/or memory subsystems, this method will often result in significant added component cost, increased latency for distant devices and/or increased system power, and may further reduce the total memory density in a given volume of space due to the need for intermediate buffering and/or re-drive of the bus(es).

Although generally not shown in the Figures, the memory modules or hub devices may also include one or more separate bus(es), such as a "presence detect" (e.g. a module serial presence detect bus), an I2C bus, a JTAG bus, an SMBus or other bus(es) which are primarily used for one or more purposes such as the determination of the hub device and/or memory module attributes (generally after power-up), the configuration of the hub device(s) and/or memory subsystem(s) after power-up or during normal operation, bring-up and/or training of the high speed interfaces (e.g. bus(es)), the reporting of fault or status information to the system and/or testing/monitoring circuitry, the determination of specific failing element(s) and/or implementation of bus repair actions such as bitlane and/or segment sparing, the determination of one or more failing devices (e.g. memory and/or support device(s)) possibly with the invoking of device replacement (e.g. device "sparing"), parallel monitoring of subsystem operation or other purposes, etc. The one or more described buses would generally not be intended for primary use as high speed memory communication bus(es). Depending on the bus characteristics, the one or more bus(es) might, in addition to previously described functions, also provide a means by which the valid completion of operations and/or failure identification could be reported by the hub devices and/or memory module(s) to the memory controller(s), the processor, a service processor, a test device and/or other functional element permanently or temporarily in communication with the memory subsystem and/or hub device.

In other exemplary embodiments, performances similar to those obtained from point-to-point bus structures can be obtained by adding switch devices to the one or more communication bus(es). These and other solutions may offer increased memory packaging density at lower power, while otherwise retaining many of the characteristics of a point-to-point bus. Multi-drop busses provide an alternate solution, albeit often limiting the maximum operating frequency to a frequency lower than that available with the use of an optimized point-to-point bus structure, but at a cost/performance point that may otherwise be acceptable for many applications. Optical bus solutions may permit significantly increased frequency and bandwidth vs. the previously-described bus structures, using point-to-point or multi-drop or related structures, but may incur cost and/or space impacts when using contemporary technologies.

As used herein the term "buffer" or "buffer device" refers to an interface device which includes temporary storage circuitry (such as when used in a computer), especially one that accepts information at one rate (e.g. a high data rate) and delivers it another (e.g. a lower data rate), and vice versa. Data rate multipliers of 2:1, 4:1, 5:1, 6:1, 8:1, etc. may be utilized in systems utilizing one or more buffer device(s) such as those described herein, with such systems often supporting multiple data rate multipliers—generally on a per-port basis. In exemplary embodiments, a buffer is an electronic device that provides compatibility between two signals (e.g. one or more of changing voltage levels, converting data rates, etc.). The term "hub" may be used interchangeably with the term "buffer" in some applications. A hub is generally described as a device containing multiple ports that enable connection to one or more devices on each port. A port is a portion of an interface that serves a congruent I/O functionality (e.g., in the exemplary embodiment, a port may be utilized for sending and receiving information such as data, address, command and control information over one of the point-to-point links (which may further be comprised of one or more bus(es)), thereby enabling communication with one or more memory devices. A hub may further be described as a device that connects several systems, subsystems, or networks together, and may include logic to merge local data into a communication data stream passing through the hub device. A passive hub may simply forward messages, while an active hub, or repeater, may amplify, re-synchronize and/or refresh a stream of data (e.g. data packets) which otherwise would deteriorate in signal quality over a distance. The term hub device, as used herein, refers primarily to one or more active devices that also include logic (including hardware and/or software) for directly and/or indirectly connecting to and communicating with one or more memory device(s) utilizing one communication means to another communication means (e.g. one or more of an upstream and downstream bus and/or other bus structure). The hub device may further include one or more traditional "memory controller" functions such as the conversion of high-level address and/or commands into technology-specific memory device information, scheduling and/or re-ordering of memory operations, the inclusion of local data caching circuitry and/or include other traditional memory controller and/or memory system functions.

Also as used herein, the term "bus" refers to one of the sets of conductors (e.g., wires, printed circuit board traces or other connection means) between devices, cards, modules and/or other functional units. The data bus, address bus and control signals, despite their names, generally constitute a single bus since each are often useless without the others. A bus may include a plurality of signal lines, each signal line having two or more connection points that form a transmission path that enables communication between two or more transceivers, transmitters and/or receivers. The term "channel", as used herein, refers to the one or more busses containing information such as data, address(es), command(s) and control(s) to be sent to and received from a system or subsystem, such as a memory, processor or I/O system. Note that this term is often used in conjunction with I/O or other peripheral equipment; however the term channel has also been utilized to describe the interface between a processor or memory controller and one of one or more memory subsystem(s).

Further, as used herein, the term "daisy chain" refers to a bus wiring structure in which, for example, device A is wired to device B, device B is wired to device C, etc . . . The last device is typically wired to a resistor or terminator. All devices may receive identical signals or, in contrast to a simple bus, each device may modify, re-drive or otherwise act upon one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. The terms daisy chain and cascade connect may be used interchangeably when a daisy chain structure includes some form of re-drive and/or "repeater" function. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors, optical carriers and/or other information transfer method, generally configured as a single carrier or as two or more carriers, in a twisted, parallel, or concentric arrangement, used to transport at least one logical signal.

Memory devices are generally defined as integrated circuits that are comprised primarily of memory (storage) cells, such as DRAMs (Dynamic Random Access Memories), SRAMs (Static Random Access Memories), FeRAMs (Ferro-Electric RAMs), MRAMs (Magnetic Random Access Memories), ORAMs (optical random access memories), Flash Memories and other forms of random access and/or pseudo random access storage devices that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs, QDR (Quad Data Rate) Synchronous DRAMs, Toggle-mode DRAMs or any of the expected follow-on devices such as DDR2, DDR3, DDR4 and related technologies such as Graphics RAMs, Video RAMs, LP RAMs (Low Power DRAMs) which are often based on at least a subset of the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package and/or or integrated onto a single device—based on technology, power, space, cost and other tradeoffs. In addition, one or more of the various passive devices such as resistors, capacitors may be integrated into the support chip packages and/or into the substrate, board or raw card itself, based on technology, power, space, cost and other tradeoffs. These packages may also include one or more heat sinks or other cooling enhancements, which may be further attached to the immediate carrier or be part of an integrated heat removal structure that contacts more than one support and/or memory devices.

Memory devices, hubs, buffers, registers, clock devices, passives and other memory support devices and/or components may be attached to the memory subsystem via various methods including solder interconnects, conductive adhesives, socket assemblies, pressure contacts and other methods which enable communication between the two or more devices and/or carriers via electrical, optical or alternate communication means.

The one or more memory modules, memory cards and/or alternate memory subsystem assemblies and/or hub devices may be electrically connected to the memory system, processor complex, computer system or other system environment via one or more methods such as soldered interconnects, connectors, pressure contacts, conductive adhesives, optical interconnects and other communication and power delivery methods. Inter-connection systems may include mating connectors (e.g. male/female connectors), conductive contacts and/or pins on one carrier mating with a compatible male or female connection means, optical connections, pressure contacts (often in conjunction with a retaining mechanism) and/or one or more of various other communication and power delivery methods. The interconnection(s) may be disposed along one or more edges of the memory assembly, may include one or more rows of interconnections and/or be located a distance from an edge of the memory subsystem depending on such application requirements as the connection structure, the number of interconnections required, performance requirements, ease of insertion/removal, reliability, available space/volume, heat transfer/cooling, component size and shape and other related physical, electrical, optical, visual/physical access, etc. Electrical interconnections on contemporary memory modules are often referred to as contacts, pins, tabs, etc. Electrical interconnections on a contemporary electrical connector are often referred to as contacts, pads, pins, pads, etc.

As used herein, the term memory subsystem refers to, but is not limited to one or more memory devices, one or more memory devices and associated interface and/or timing/control circuitry and/or one or more memory devices in conjunction with a memory buffer, hub device, and/or switch. The term memory subsystem may also refer to a storage function within a memory system, comprised of one or more memory devices in addition to one or more supporting interface devices and/or timing/control circuitry and/or one or more memory buffers, hub devices or switches, identification devices, etc.; generally assembled onto one or more substrate(s), card(s), module(s) or other carrier type(s), which may further include additional means for attaching other devices. The memory modules described herein may also be referred to as memory subsystems because they include one or more memory devices and other supporting device(s).

Additional functions that may reside local to the memory subsystem and/or hub device include write and/or read buffers, one or more levels of local memory cache, local pre-fetch logic (allowing for self-initiated pre-fetching of data), data encryption/decryption, compression/de-compression, address and/or command protocol translation, command prioritization logic, voltage and/or level translation, error detection and/or correction circuitry on one or more busses, data scrubbing, local power management circuitry (which may further include status reporting), operational and/or status registers, initialization circuitry, self-test circuitry (testing logic and/or memory in the subsystem), performance monitoring and/or control, one or more co-processors, search engine(s) and other functions that may have previously resided in the processor, memory controller or elsewhere in the memory system. Memory controller functions may also be included in the memory subsystem such that one or more of non-technology-specific commands/command sequences, controls, address information and/or timing relationships can be passed to and from the memory subsystem, with the subsystem completing the conversion, re-ordering, re-timing between the non-memory technology-specific information and the memory technology-specific communication means as necessary. By placing more technology-specific functionality local to the memory subsystem, such benefits as improved performance, increased design flexibility/extendibility, etc., may be obtained, often while making use of unused circuits within the subsystem.

Memory subsystem support device(s) may be directly attached to the same substrate or assembly onto which the memory device(s) are attached, or may be mounted to a separate interposer, substrate, card or other carrier produced using one or more of various plastic, silicon, ceramic or other materials which include electrical, optical or other communication paths to functionally interconnect the support device(s) to the memory device(s) and/or to other elements of the memory subsystem or memory system.

Information transfers (e.g. packets) along a bus, channel, link or other interconnection means may be completed using one or more of many signaling options. These signaling options may include one or more of such means as single-ended, differential, optical or other communication methods, with electrical signaling further including such methods as voltage and/or current signaling using either single or multi-level approaches. Signals may also be modulated using such methods as time or frequency, non-return to zero, phase shift keying, amplitude modulation and others. Signal voltage levels are expected to continue to decrease, with 1.5V, 1.2V, 1V and lower signal voltages expected, as a means of reducing power, accommodating reduced technology breakdown voltages, etc.—in conjunction with or separate from the power supply voltages. One or more power supply voltages, e.g. for DRAM memory devices, may drop at a slower rate that the I/O voltage(s) due in part to the technological challenges of storing information in the dynamic memory cells.

One or more clocking methods may be utilized within the memory subsystem and the memory system itself, including global clocking, source-synchronous clocking, encoded clocking or combinations of these and other methods. The clock signaling may be identical to that of the signal (often referred to as the bus "data") lines themselves, or may utilize one of the listed or alternate methods that is more conducive to the planned clock frequency(ies), and the number of clocks required for various operations within the memory system/subsystem(s). A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem and/or may be based on a clock that is derived from the clock included as part of the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and/or other functional, configuration or related operations. Information passing from the memory subsystem(s) may include any or all of the information passing to the memory subsystem(s), however generally will not include address and command information. The information passing to or from the memory subsystem(s) may be delivered in a manner that is consistent with normal memory device interface specifications (generally parallel in nature); however, all or a portion of the information may be encoded into a 'packet' structure, which may further be consistent with future memory interfaces or delivered using an alternate method to achieve such goals as an increase communication bandwidth, an increase in memory subsystem reliability, a reduction in power and/or to enable the memory subsystem to operate independently of the memory technology. In the latter case, the memory subsystem (e.g. the hub device) would convert and/or schedule, time, etc. the received information into the format required by the receiving device(s).

Initialization of the memory subsystem may be completed via one or more methods, based on the available interface busses, the desired initialization speed, available space, cost/complexity, the subsystem interconnect structures involved, the use of alternate processors (such as a service processor) which may be used for this and other purposes, etc. In one embodiment, the high speed bus may be used to complete the initialization of the memory subsystem(s), generally by first completing a step-by-step training process to establish reliable communication to one, more or all of the memory subsystems, then by interrogation of the attribute or 'presence detect' data associated the one or more various memory assemblies and/or characteristics associated with any given subsystem, and ultimately by programming any/all of the programmable devices within the one or more memory subsystems with operational information establishing the intended operational characteristics for each subsystem within that system. In a cascaded system, communication with the memory subsystem closest to the memory controller would generally be established first, followed by the establishment of reliable communication with subsequent (downstream) subsystems in a sequence consistent with their relative position along the cascade interconnect bus.

A second initialization method would include one in which the high speed bus is operated at one frequency during the initialization process, then at a second (and generally higher) frequency during the normal operation. In this embodiment, it may be possible to initiate communication with any or all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic and/or other methods such as a power-on-rest detection via detection of a slow command identifying that function.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also provides an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) may facilitate increased function on integrated devices as well as the integration of functions previously implemented on separate devices. This integration can serve to improve overall performance of the memory system and/or subsystem(s), as well as provide such system benefits as increased storage density, reduced power, reduced space requirements, lower cost, higher performance and other manufacturer and/or customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths and/or portions of such paths (e.g. "segments" of end-to-end "bitlanes") between a given memory subsystem and the memory controller to replace failing paths and/or portions of paths, complement-re-complement techniques and/or alternate reliability enhancement methods as used in computer, communication and related systems.

The use of bus termination, on busses ranging from point-to-point links to complex multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage (such voltage directly sourced to the device(s) or indirectly sourced to the device(s) from a voltage divider, regulator or other means), or another signal. The termination device(s) may be part of a passive or active termination structure, and may reside in one or more positions along one or more of the signal lines, and/or as part of the transmitter and/or receiving device(s). The terminator may be selected to match the impedance of the transmission line, be selected as an alternate impedance to maximize the useable frequency, signal swings, data widths, reduce reflections and/or otherwise improve operating margins within the desired cost, space, power and other system/subsystem limits.

Technical effects and benefits include providing bit shadowing for interconnections in a computer system. Shadowing can be used to isolate and determine a bad bit lane or link segment over much longer periods of time than simply during an initialization or retry recovery process. This is important when relatively low bit error rates exist that may not be detected during an initialization, which can last for only a few milliseconds. The bit shadowing can run in real time with functional traffic and workloads in order to capture more complex and sophisticated events that cannot be recreated or might not occur with a re-initialization, such as chip noise, switching of other circuits or I/O, etc. Bad lanes or link segments can be switched in and out dynamically with little or no precision timing required between the two ends of the link.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

What is claimed is:

1. A communication interface device comprising:
   shadow selection logic to select a driver bit position as a shadowed driver value;
   line drivers to transmit data for the selected driver bit position and the shadowed driver value on separate link segments of a bus;
   shadow compare logic to compare a selected received value with a shadowed received value from the bus and identify a miscompare in response to a mismatch of the compare; and
   shadow counters to count a rate of the miscompare relative to a bus error rate over a period of time, wherein a defective link segment is identified in response to the rate of the miscompare within a predefined threshold of the bus error rate;
   wherein the bus cascade interconnects the communication interface device with a second communication interface device, and the bus further comprises downstream lanes and upstream lanes of differential-ended unidirectional link segments, the downstream lanes comprising: 13 downstream bit lanes, 2 spare downstream bit lanes, and a downstream clock, and the upstream lanes comprising: 20 upstream bit lanes, 2 spare upstream bit lanes and an upstream clock.

2. The communication interface device of claim 1 wherein the bus includes multiple data link segments, a clock link segment, a first spare link segment to provide capacity for the shadowed driver value and a second spare link segment selectable to replace one of the data link segments or the clock link segment.

3. The communication interface device of claim 1 wherein bit positions associated with the selected driver bit position, the shadowed driver value, the selected received value, and the shadowed received value are rotated to test multiple link segments of the bus.

4. The communication interface device of claim 1 wherein the communication interface device is one of a memory controller and a memory hub device to communicate high-speed memory access commands via the bus.

5. The communication interface device of claim 1 wherein the line drivers of the communication interface device transmit data to the shadow compare logic of the second communication interface device, and the line drivers of the second communication interface device transmit data to the shadow compare logic of the communication interface device.

6. The communication interface device of claim 1 wherein the bus error rate is determined as a ratio of bus errors to bus transactions, and further wherein the bus errors are determined using cyclic redundancy checks (CRCs) of data on the link segments of the bus excluding the link segment upon which the shadowed received value is received.

7. The communication interface device of claim 1 wherein an unused link segment is depowered.

8. A memory system comprising:
   a memory controller comprising:
      shadow selection logic to select a driver bit position as a shadowed driver value; and
      line drivers to transmit data for the selected driver bit position and the shadowed driver value on separate link segments of a bus; and
   a memory hub device in communication with the memory controller via the bus, wherein the memory hub device comprises:
      shadow compare logic to compare a selected received value with a shadowed received value from the bus and identify a miscompare in response to a mismatch of the compare; and
      shadow counters to count a rate of the miscompare relative to a bus error rate over a period of time, wherein a defective link segment is identified in response to the rate of the miscompare within a predefined threshold of the bus error rate.

9. The memory system of claim 8 wherein the bus includes multiple data link segments, a clock link segment, a first spare link segment to provide capacity for the shadowed driver value and a second spare link segment selectable to replace one of the data link segments or the clock link segment.

10. The memory system of claim 9 wherein the clock link segment is identified as defective in response to the rate of the miscompare for all of the data link segments being below the predefined threshold of the bus error rate and the bus error rate being above an error rate threshold.

11. The memory system of claim 8 wherein bit positions associated with the selected driver bit position, the shadowed driver value, the selected received value, and the shadowed received value are rotated to test multiple link segments of the bus.

12. The memory system of claim 8 wherein the bus cascade interconnects the memory controller with the memory hub device, and the bus further comprises downstream lanes and upstream lanes of differential-ended unidirectional link segments, the downstream lanes comprising: 13 downstream bit lanes, 2 spare downstream bit lanes, and a downstream clock, and the upstream lanes comprising: 20 upstream bit lanes, 2 spare upstream bit lanes and an upstream clock.

13. The memory system of claim 12 wherein the memory controller and the memory hub device both include the shadow selection logic, the line drivers, the shadow compare logic, and the shadow counters, and further wherein the line drivers of the memory controller transmit data to the shadow compare logic of the memory hub device via the downstream lanes, and the line drivers of the memory hub device transmit data to the shadow compare logic of the memory hub device via the upstream lanes.

14. The memory system of claim 8 wherein the bus error rate is determined as a ratio of bus errors to bus transactions, and further wherein the bus errors are determined using cyclic redundancy checks (CRCs) of data on the link segments of the bus excluding the link segment upon which the shadowed received value is received.

15. The memory system of claim 8 wherein an unused link segment is depowered.

16. A method for providing bit shadowing in a memory system, the method comprising:
   selecting a driver bit position as a shadowed driver value;
   transmitting data for the selected driver bit position and the shadowed driver value on separate link segments of a bus, the bus comprises downstream lanes and upstream lanes of differential-ended unidirectional link segments;
   comparing a selected received value with a shadowed received value from the bus;
   identifying a miscompare in response to a mismatch of the compare;
   counting a rate of the miscompare relative to a bus error rate over a period of time; and
   identifying a defective link segment in response to the rate of the miscompare being within a predefined threshold of the bus error rate.

17. The method of claim 16 further comprising:
rotating bit positions associated with the selected driver bit position, the shadowed driver value, the selected received value, and the shadowed received value to test multiple link segments of the bus.

18. The method of claim 16 wherein the downstream lanes comprising: 13 downstream bit lanes, 2 spare downstream bit lanes, and a downstream clock, and the upstream lanes comprising: 20 upstream bit lanes, 2 spare upstream bit lanes and an upstream clock, and the method of claim 16 is performed independently for the link segments of the downstream lanes and the upstream lanes.

19. The method of claim 16 wherein a clock link segment of the bus is identified as defective in response to the rate of the miscompare for all data link segments of the bus being below the predefined threshold of the bus error rate and the bus error rate being above an error rate threshold.

20. A design structure tangibly embodied in a machine-readable medium for designing, manufacturing, or testing an integrated circuit, the design structure comprising:
shadow selection logic to select a driver bit position as a shadowed driver value;
driver logic to transmit data for the selected driver bit position and the shadowed driver value on separate link segments of a bus;
shadow compare logic to compare a selected received value with a shadowed received value from the bus and identify a miscompare in response to a mismatch of the compare; and
counting logic to count a rate of the miscompare relative to a bus error rate over a period of time, wherein a defective link segment is identified in response to the rate of the miscompare within a predefined threshold of the bus error rate.

21. The design structure of claim 20, wherein the design structure comprises a netlist.

22. The design structure of claim 20, wherein the design structure resides on storage medium as a data format used for the exchange of layout data of integrated circuits.

23. The design structure of claim 20, wherein the design structure resides in a programmable gate array.

* * * * *